(12) United States Patent
Matsumoto et al.

(10) Patent No.: US 6,800,862 B2
(45) Date of Patent: Oct. 5, 2004

(54) ION IMPLANTING APPARATUS AND ION IMPLANTING METHOD

(75) Inventors: Takao Matsumoto, Kyoto (JP); Kohichi Orihira, Kyoto (JP); Kazuhiro Nakao, Kyoto (JP); Mitsunori Nakamura, Kyoto (JP)

(73) Assignee: Nissin Electric Co., Ltd., Kyoto (JP)

( * ) Notice: Subject to any disclaimer, the term of this patent is extended or adjusted under 35 U.S.C. 154(b) by 45 days.

(21) Appl. No.: 10/314,117

(22) Filed: Dec. 9, 2002

(65) Prior Publication Data

US 2003/0127606 A1 Jul. 10, 2003

(30) Foreign Application Priority Data

Dec. 10, 2001 (JP) .................................. P.2001-375806

(51) Int. Cl.[7] .......................... B01D 54/44; H01J 49/00; H01J 37/08
(52) U.S. Cl. ................... 250/492.21; 250/282; 250/288; 250/281
(58) Field of Search ............................... 250/281, 288, 250/282, 492.21

(56) References Cited

U.S. PATENT DOCUMENTS 4,016,421 A * 4/1977 Hull et al. .................. 250/281

* cited by examiner

*Primary Examiner*—Jack Berman
*Assistant Examiner*—Kalimah Fernandez
(74) *Attorney, Agent, or Firm*—Finnegan, Henderson, Farabow, Garrett & Dunner, L.L.P.

(57) ABSTRACT

The ion implanting apparatus is provided with a control device which controls the operating state thereof in a period during which ion implantation is not carried out for a substrate in the state in any mode selected from the above (a) twilight mode in which the flow rate of the raw gas supplied to an ion source and the power supplied from a plasma producing power source are reduced to values capable of keeping plasma production in the ion source, (b) magnet-off mode in which in addition to the state in the twilight mode, the outputs from an energy separating magnet power source, scanning magnet power source and beam paralleling magnet power source are stopped, and (c) shut-down mode in which the supply of the raw gas is stopped and the outputs from the power sources are stopped.

6 Claims, 2 Drawing Sheets

ION IMPLANTING APPARATUS AND ION IMPLANTING METHOD

BACKGROUND OF THE INVENTION

1. Field of the Invention

This invention relates to an ion implanting apparatus and ion implanting method for implanting ions by irradiating a substrate (e.g. semiconductor substrate through the following description of the specification) with an ion beam. More particularly, the present invention relates to an ion implanting apparatus and an ion implanting method which can save energy for operating the ion implanting apparatus.

2. Description of the Related Art

In a related art ion implanting apparatus, in the period during which ion implantation is not executed for a substrate, e.g. in the period from when the ion implantation has been completed for a certain lot to when the ion implantation is started for a subsequent lot, the operating state of the apparatus was the following state (a) or (b). That is, the operation state (a) is to maintain in the same state as during the implantation except that the substrate is not irradiated with the ion beam while the ion beam of a required ion species is produced. The operation state (b) is to place in the state where almost all the devices constituting the ion implanting apparatus are stopped.

In recent years, the ion implanting apparatus has been also required to implement energy saving inclusive of reduction in power consumption as part of measure for environment protection. More widely speaking, the ion implanting apparatus has been required to implement not only power consumption but also reduction in the COO (Cost of Ownership: total maintenance cost relative to the operation and maintenance of the apparatus) such as raw gas consumption, exhaustion of devices, maintenance cost, etc.

However, since the operation state of (a) continues to produce the ion beam of the required ion species, not only wasteful power or raw gas for an ion source is consumed, but also exhaustion/deterioration of the ion source, a gas removal apparatus for removing harmful substances contained in exhaust gases and other devices is hastened to shorten their life. Therefore, reduction in COO cannot be implemented.

On the other hand, although the operation state of (b) can implement the reduction in COO, almost all the devices are stopped. Therefore, this method has a drawback that the start-up of the ion implanting apparatus is very slow when the ion implantation is resumed.

SUMMARY OF THE INVENTION

An object of this invention is to provide an ion implanting apparatus and an ion implanting method which can implement reduction in COO and make rapid start-up when implantation is resumed.

In order to accomplish the object above, the following means are adopted. According to the present invention, there is provided a first ion implanting apparatus comprising:

an ion source for ionizing a raw gas to produce a plasma and extracting an ion beam from the plasma;

a gas supplying device for supplying the raw gas to the ion source;

a plasma producing power source for supplying a power for producing the plasma to the ion source;

an energy separating magnet for selectively deriving ions having specific energy from the ion beam extracted from the ion source;

an energy separating magnet power source for supplying a power for energy separation to the energy separating magnet;

a scanning magnet for scanning the ion beam derived from the energy separating magnet;

a scanning magnet power source for supplying a power for scanning to the scanning magnet;

a beam paralleling magnet for parallel-scanning the ion beam derived from the scanning magnet so that it is in parallel to a reference axis;

a beam paralleling magnet power source for supplying a power for beam paralleling to the beam paralleling magnet;

an implanting chamber in which a substrate is irradiated with the ion beam derived from the beam paralleling magnet to implant ions into the substrate; and a control device for controlling an operating state of the ion implanting apparatus in a period during which the ion implantation is not carried out for the substrate in a state in any mode selected from (a) a twilight mode in which a flow rate of the raw gas supplied from the gas supplying device to the ion source and the power supplied from the plasma producing power source to the ion source are reduced to values smaller than those when the ion implantation is carried out for the substrate and capable of keeping plasma production in the ion source; (b) a magnet-off mode in which the flow rate of the raw gas supplied from the gas supplying device to the ion source and the power supplied from the plasma producing power source to the ion source are reduced to values smaller than those when the ion implantation is carried out for the substrate and capable of keeping plasma production in the ion source, and outputs from the energy separating magnet power source, scanning magnet power source and beam paralleling magnet power source are stopped; and (c) a shut-down mode in which the supply of the raw gas from the gas supplying device to the ion source is stopped and outputs from the power sources are stopped.

The above-mentioned first ion implanting apparatus, preferably, further comprising:

an ion beam extracting power source for applying a voltage for extracting the ion beam to the ion source;

a mass separating magnet for selectively deriving ions having a specific mass number and valence from the ion beam extracted from the ion source;

a mass separating magnet power source for supplying a power for mass separation to the mass separating magnet;

an accelerating tube for accelerating or decelerating the ion beam derived from the mass separating magnet; and an accelerating power source for applying a voltage for acceleration or deceleration to the accelerating tube, wherein in the shut-down mode (c), outputs from the ion beam extracting power source, the mass separating magnet power source and the accelerating power source are stopped.

In accordance with above configuration, the operating state of the ion implanting apparatus in a period during which the ion implantation is not carried out for the substrate can be controlled in the state in any mode selected from the above (a) twilight mode, (b) magnet-off mode and (c) shut-down mode.

The twilight mode provides the smallest reduction quantity of COO among the three modes, but can still reduce the COO relative to the consumption of at least the raw gas and the power of the plasma producing power source. In addition, this mode can keep the plasma producing state in the ion source, and hence is the most rapid in the start-up of the apparatus in resuming the implantation.

The shut-down mode, which supply of the raw gas and almost all the main power sources are stopped, is the slowest in the start-up of the apparatus in resuming the implantation among the three modes, but is the most advantageous to the reduction of COO.

The magnet-off mode, which is an intermediate mode between the twilight mode and shut-down mode, is intermediate between both modes in the reduction quantity of COO and start-up speed of the apparatus.

As described above, in accordance with this ion implanting apparatus, the operating state of the apparatus in a period during which the ion implantation is not carried out for the substrate can be controlled in the state in any mode selected from the above three modes according to the request from a user. Therefore, the reduction of COO can be made and the start-up of the apparatus can be quickened.

Further, according to the present invention, there is also provided a second ion implanting apparatus comprising:

an ion source for ionizing a raw gas to produce a plasma and extracting the ion beam from the plasma;

a gas supplying device for supplying the raw gas to the ion source;

a main pump and a roughing pump for vacuum evacuating an interior of a beam line vacuum chamber which is connected to the ion source and through which the ion beam passes;

an implanting chamber in which a substrate is irradiated with the ion beam extracted from the ion source to implant ions into the substrate;

a vacuum preliminary chamber in which the substrate is taken in and out between the implanting chamber and an external atmosphere;

a vacuum preliminary chamber pump for vacuum evacuating an interior of the vacuum preliminary chamber; and a control device for executing at least one of (a) a roughing pump low-speed mode in which the roughing pump is controlled to operate at a revolving speed lower than a steady revolving speed under conditions that the interior of the beam line vacuum chamber is in a predetermined high vacuum state and the raw gas is not supplied from the gas supplying device to the ion source; and (b) a vacuum preliminary chamber pump low-speed mode in which the vacuum preliminary chamber pump is controlled to operate at the revolving speed lower than the steady revolving speed when an interior of the vacuum preliminary chamber has reached a predetermined vacuum degree.

As in this ion implanting apparatus, by operating at least one of the roughing pump and vacuum preliminary chamber pump at the revolving speed lower than a steady revolving speed under a predetermined condition, the COO mainly relative to the power consumption for operating the vacuum pumps can be reduced. In addition, the operation of the vacuum pump is not stopped so that the pump can quickly restore to the steady revolving speed when necessary. Thus, the start-up of the apparatus when the implantation processing is resumed can be quickened.

A control device having both functions described above of the first and the second ion implanting apparatus may be provided.

DETAILED DESCRIPTION OF THE INVENTION

Figure 1:
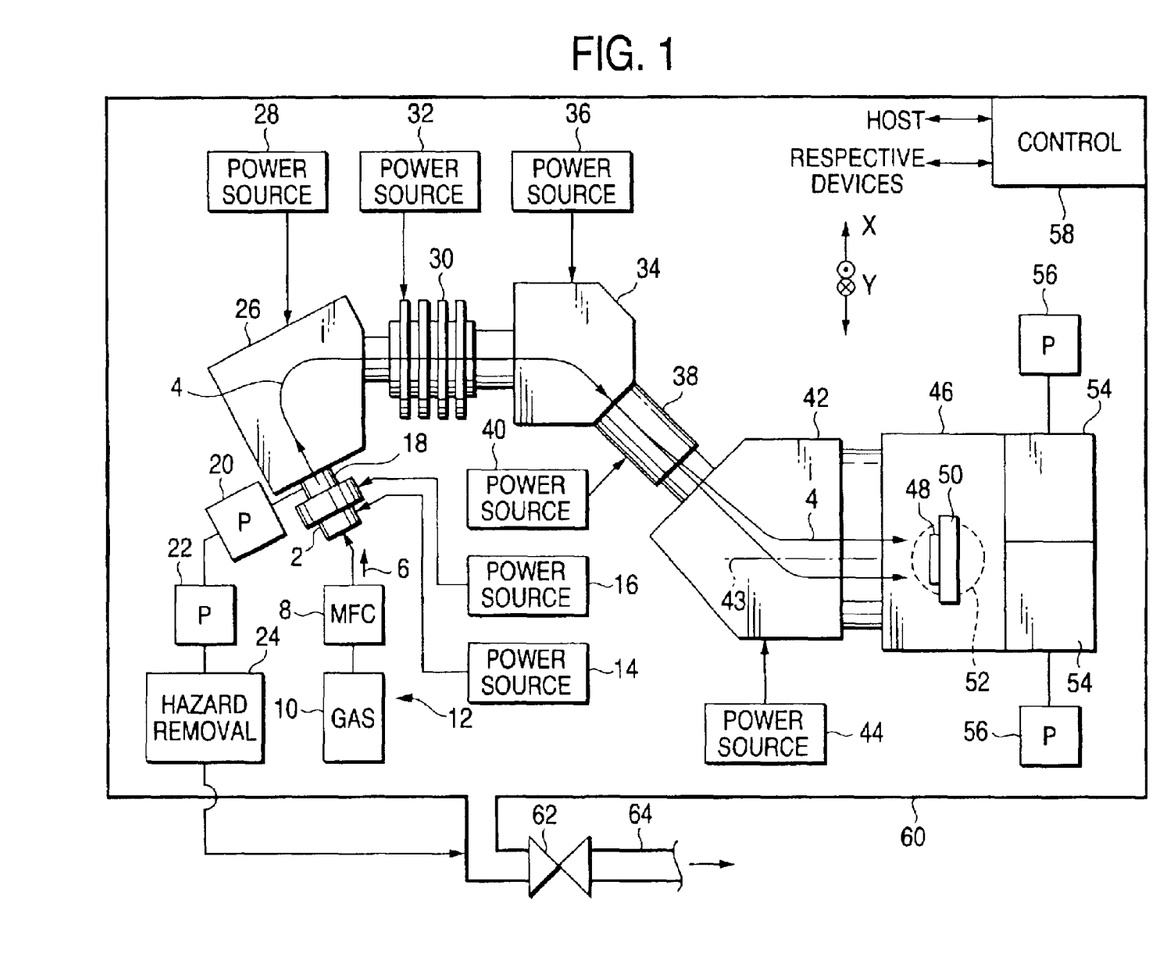
FIG. 1 is a plan view showing an example of the ion implanting apparatus according to this invention.

FIG. 1 is a plan view of an embodiment of an ion implanting apparatus according to this invention. Such an ion implanting apparatus is disclosed in e.g. JP-A-8-115701 and JP-A-2001-143651 except that the control in an energy-saving operation mode described below is carried out by a control device 58.

The ion implanting apparatus shown in FIG. 1 is an embodiment of a "hybrid scan system". That is, an ion beam taken out from an ion source 2 is scanned in a reciprocating way in an X direction (e.g. horizontal direction, also in the following description of the specification) under an electric field or magnetic field. Further, a substrate 48 which is an object to be implanted is mechanically scanned in the reciprocating way in a Y direction (e.g. vertical direction, also in the following description of the specification) substantially orthogonal to the X direction. More specifically, FIG. 1 shows an embodiment of a hybrid parallel scan system in which the ion beam 4 is scanned in parallel along a reference axis 43.

The ion implanting apparatus as shown includes the ion source 2, a gas supplying device 12, and a plasma producing power source 14, an ion beam extracting power source 16. The ion source 2 ionizes a raw gas 6 to produce plasma 72 (FIG. 2) and extracts the ion beam from the plasma 72. The gas supplying device 12 supplies the raw gas 6 to the ion source 2. The plasma producing power source 14 supplies the power for producing the plasma to the ion source 2. The ion beam extracting power source 16 applies the voltage for extracting the ion beam 4 to the ion source 2.

In this embodiment, the gas supplying device 12 includes a gas source 10 for supplying the raw gas 6 and a flow controller 8 for controlling the flow rate of the raw gas 6. The gas supplying device 12 may be a system in which a solid material is vaporized and the vapor is supplied as the raw gas 6.

Figure 2:
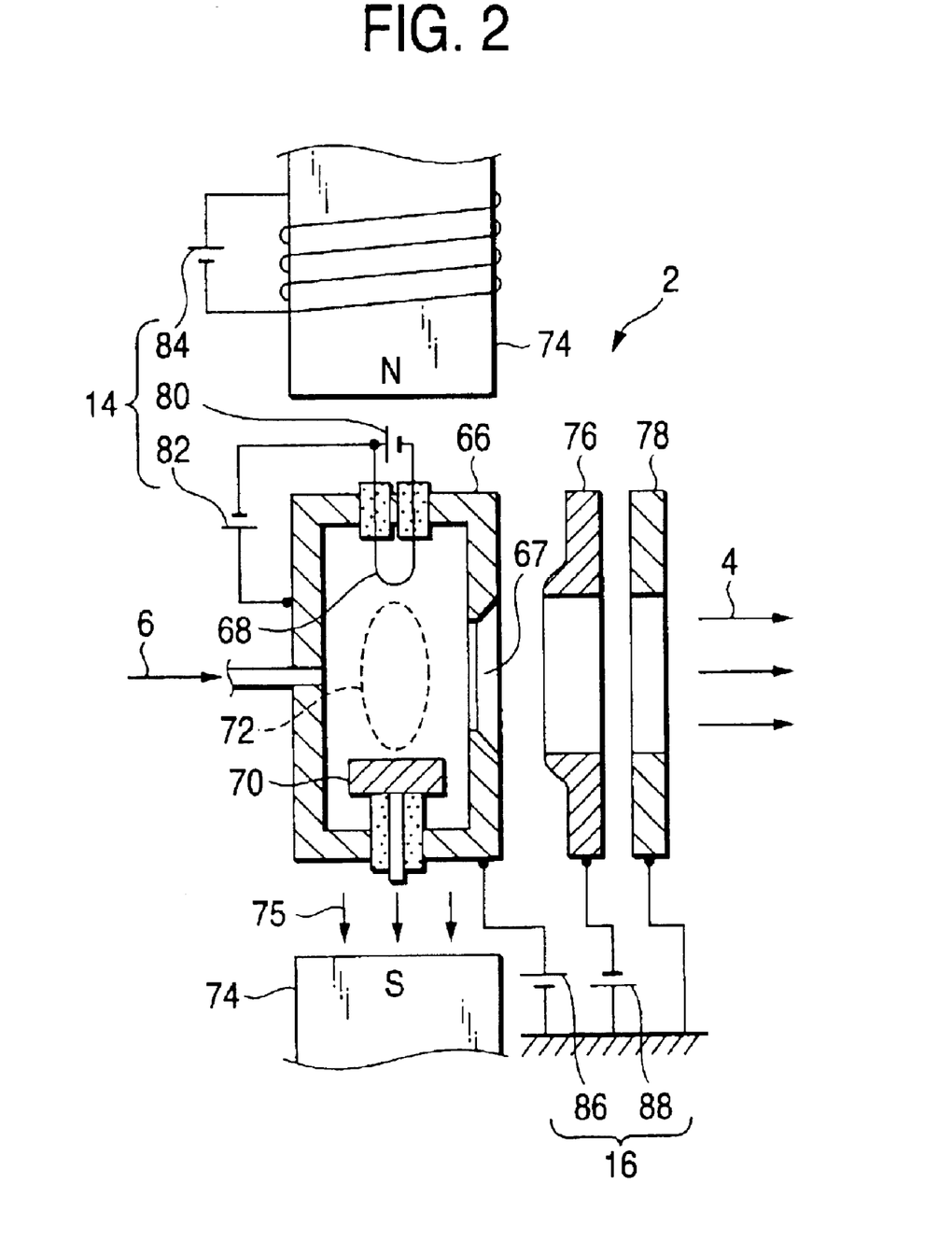
FIG. 2 is a view showing the details of an ion source and a power source therefor in FIG. 1.

The details of the ion source 2 and power source therefor are shown in FIG. 2. The ion source 2 is a "Bernas" type ion source as disclosed in e.g. JP-A-9-35648 and includes a plasma production chamber 66 having an ion extracting hole 67.

The plasma production chamber 66 incorporates a filament 68 and a reflector 70. The filament 68 emits thermal electrons to produce an arc discharge between itself and the chamber and ionizes the introduced raw gas to produce the plasma 72. The reflector 70 reflects the electrons emitted from the filament 68. The filament 68 and the reflector 70 are located oppositely to each other. A magnetic field 75 is applied to the interior of the plasma production chamber 66 by a source magnet 74 outside the chamber 66 in a direction of a line connecting the filament 68 to the reflector 70. The magnetic field 75 and reflector 70 serve to enhance the ionizing efficiency of the raw gas 6 to produce the plasma 72 with a high density.

In this embodiment, the plasma producing power source 14 includes a filament power source 80 for heating the above filament 68, an arc power source 82 for producing the above arc discharge and a source magnet power source 84 for exciting the source magnet 74.

The ion beam 4 is extracted from the plasma 72 within the plasma production chamber 66 by the action of an electric field through a extracting electrode 76 and a ground electrode 78 in this embodiment. For this purpose, a positive high voltage (e.g. about several tens of kilovolts) is applied to the plasma production chamber 66 from an extracting power source 86. The extracting electrode 76 is supplied with a negative voltage (e.g. about several kV) from a reducing power source 88 for reducing backward electrons from the downstream side. The grounding electrode 78 is connected to ground. In this embodiment, the extracting power source 86 and suppressing power source 88 constitute an ion beam extracting power source 16.

Referring to FIG. 1 again, the ion implanting apparatus further includes a mass separating magnet 26, a mass separating magnet power source 28, an accelerating tube 30, an accelerating power source 32, an energy separating magnet 34, an energy separating magnet power source 36, a scanning magnet 38, a scanning magnet power source 40, a beam paralleling magnet 42, a beam paralleling magnet power source 44, and an implanting chamber 46. The mass separating magnet 26 selectively derives ions having a specific mass number and valence from the ion beam 4 extracted from the ion source 2. The mass separating magnet power source 28 supplies the power for mass separation to the mass separating magnet 26. The accelerating tube 30 accelerates (in an accelerating mode) or decelerates (in a decelerating mode) the ion beam 4 derived from the mass separating magnet 26. The accelerating power source 32 applies a high voltage (e.g. several tens of kilovolts to hundred kV) for acceleration or deceleration to the accelerating tube 30. The energy separating magnet 34 selectively derives ions having specific energy from the ion beam 4 derived from the accelerating tube 30. The energy separating magnet power source 36 supplies the power for energy separation to the energy separating magnet 34. The scanning magnet 38 scans the ion beam 4 derived from the energy separating magnet 34 in a reciprocating manner by the action of the magnetic field in a plane including the X direction. The scanning magnet power source 40 supplies the power for scanning to the scanning magnet 38. The beam paralleling magnet 42 parallel-scans the ion beam 4 in corporation with the scanning magnet 38 by bending back the ion beam derived from the scanning magnet 38 so that it is in parallel to the reference axis 43. The beam paralleling magnet power source 44 supplies the power for beam paralleling to the beam paralleling magnet 42. In the implanting chamber 46, the substrate 48 is irradiated with the ion beam 4 derived from the beam paralleling magnet 42 to implant ions into the substrate 48.

Further, the implanting chamber 46 incorporates a scanning mechanism 52 for mechanically scanning the substrate 48 in a reciprocating manner in the Y direction within an area to be irradiated with the ion beam 4. The substrate 48 is held by a holder 50 in the scanning mechanism 52.

The interior of the implanting chamber 46 is vacuum-evacuated in a high vacuum (e.g. about $10^{-3}$ Pa–$10^{-4}$ Pa) by a vacuum pump (not shown). The implanting chamber 46 is adjacent to a vacuum preliminary chamber (also called an air locking chamber) through a vacuum valve (not shown) in which the substrate 48 is taken in and out between the implanting chamber 46 and the external atmosphere. In this embodiment, two vacuum preliminary chambers 54 are provided in order to improve the throughput. A single vacuum preliminary chamber 54 may be provided. An example of the scanning mechanism 52 and vacuum preliminary chamber 54 is disclosed in e.g. JP-7-70298.

Each of the vacuum preliminary chambers 54 is connected to a vacuum preliminary chamber pump 56, by which the vacuum preliminary chamber 54 is vacuum-evacuated in a lower vacuum (e.g. about 1 Pa~$10^{-1}$ Pa), than in the implanting chamber 46, which may also be called roughing. The vacuum preliminary chamber pump 56 is may be e.g. a dry pump.

The outlet of the ion source 2 is connected to a beam line vacuum chamber 18 through which the ion beam 4 passes. The interior of the beam line vacuum chamber 18 and ion source 2 connected thereto is evacuated in a predetermined high vacuum by a main pump 20 and a roughing pump 22 which are connected to the beam line vacuum chamber 18. For example, they are evacuated in a high vacuum of about $10^{-3}$ Pa~$10^{-4}$ Pa in a state before the raw gas 6 is introduced. The main pump 20 may be e.g. turbo molecular pump, and the roughing pump 22 may be e.g. a dry pump for evacuating the outlet side of the main pump 20.

The exhaust gas from the roughing pump 22 contains the raw gas 6 introduced into the ion source 2. Therefore, as disclosed in e.g. JP-A-2001-216930, the exhaust gas is exhausted through a hazardous gas removing device 24 for removing the hazardous material contained in the exhausted gas. The exhaust gas is exhausted into e.g. an exhaust duct 64 described later.

The devices as described above are housed within a cabinet 60. The cabinet incorporates a control device 58 for controlling the ion implanting apparatus inclusive of the control in an energy saving operating mode as described later by controlling the above devices and an exhaust valve 62 described below.

The cabinet 60 (e.g. upper portion) is connected to the exhaust duct 64 through the exhaust valve 62. The exhaust duct 64 is further connected to an exhaust fan (not shown). The heat generated in the cabinet 60 is exhausted through the exhaust duct 64.

In this embodiment, the control device 58 has a function of executing energy saving modes of (1) mode relative to beam production, (2) mode relative to the operation of a vacuum pump and (3) mode to heat exhaustion. The respective modes will be described below in details.

(1) Modes Relative to Beam Production

The control device 58 has a function of controlling the ion implanting apparatus in the operating state of any mode selected from the following modes of (a) to (c), in a period during which after the ion implanting apparatus has been started up in a state producing the ion beam 4 of a desired ion species (mass number and valence), ion implantation is not still carried out for the substrate 48. The states of the respective modes are listed in Table 1, and will be described below.

TABLE 1

|  | Twilight Mode | Magnet-off Mode | Shut-down Mode |
| --- | --- | --- | --- |
| Raw Gas 6 | Flow Reduction | Flow Reduction | Supply Stop |
| Power Source 14 for Plasma Production | Output Reduction | Output Reduction | Output Stop |
| Power Source 16 for Ion Beam Extracting | Implanting State | Implanting State | Output Stop |
| Power Source 28 for Mass Separation Magnet | Implanting State | Implanting State | Output Stop |
| Accelerating Power Source 32 | Implanting State | Implanting State | Output Stop |
| Power Source 36 for Energy Separating Magnet | Implanting State | Output Stop | Output Stop |

TABLE 1-continued

|  | Twilight Mode | Magnet-off Mode | Shut-down Mode |
|---|---|---|---|
| Power Source 40 for Scanning Magnet | Implanting State | Output Stop | Output Stop |
| Power Source 44 for Beam Paralleling Magnet | Implanting State | Output Stop | Output Stop |

(a) Twilight Mode

This mode is a mode in which the flow rate of the raw gas 6 supplied from the gas supplying device 12 to the ion source 2 and the power supplied (outputted) from the plasma producing power source 14 to the ion source 12 are reduced to values than those when the ion implantation is executed for the substrate 48 and also capable of keeping plasma production in the ion source 2. More specifically, the flow rate of the raw gas 6 supplied from the gas supplying device 12 to the ion source 2 and the power supplied (outputted) from the plasma producing power source 14 to the ion source 12 are reduced to small values enough to not extinguish the plasma 72.

To reduce the power outputted from the plasma producing power source 14 is more specifically to reduce the filament current to pass through the filament 68 from the filament power source 80 shown in FIG. 2 and the arc current outputted from the arc power source 82, and also reduce the source magnet current outputted from the source magnet power source 84.

The respective power sources 16, 28, 32, 36, 40 and 44 other than the power sources mentioned above are held in a state where the ion implantation is executed for the substrate 48 (This state is referred to an "implanting state").

This twilight mode, which does not stop the outputs from the devices, provides the smallest reduction quantity of COO among the three modes, but can still reduce the COO relative to the consumption of at least the raw gas and the power of the plasma producing power source 14. In addition, this mode can keep the plasma producing state in the ion source 2, and hence is the most rapid in the start-up of the apparatus in resuming the implantation. This is because the flow rate of the raw gas 6 and the output from the plasma producing power source 14 have only to be boosted to predetermined values.

(b) Magnet-Off Mode

This mode is a mode in which the flow rate of the raw gas 6 supplied from the gas supplying device 12 to the ion source 2 and the power supplied (outputted) from the plasma producing power source 14 are reduced to values than those when the ion implantation is executed for the substrate 48 and also capable of keeping plasma production in the ion source 2. More specifically, the flow rate of the raw gas 6 supplied from the gas supplying device 12 to the ion source 2 and the power supplied (outputted) from the plasma producing power source 14 are reduced to small values enough to not extinguish the plasma 72. Further, the outputs from the energy separating magnet power source 36, scanning magnet power source 40 and beam paralleling magnet power source 48 are stopped.

The respective power sources 16, 28 and 32 other than the power sources mentioned above are held in a state where the ion implantation is executed for the substrate 48 (This state is referred to an "implanting state").

Incidentally, the reason why the outputs from the ion beam extracting power source 16 and mass separation magnet 28 are not stopped in this mode is that it takes a relatively long time to set the current necessary to mass-separate the desired ion species by the mass separation magnet 26. Therefore, in this mode, the ion beam extracting power source 16 is not stopped and the current supplied to the mass separation magnet 26 is maintained unchanged, thereby accelerating the start-up of the apparatus.

The reason why the output from the accelerating power source 32 is not stopped is that if the flow rate of the raw gas 6 and the output from the plasma producing power source 14 are limited to the values enough to keep the plasma production in the ion source 2, the ion beam 4 is not almost extracted from the ion source 2. In such a state, load is not almost applied to the accelerating power source 32 so that it is not necessary to stop the output thereof forcibly. However, the output from the accelerating power source may be stopped.

This magnet-off mode, which is an intermediate mode between the twilight mode and shut-down mode, is intermediate between both mode in the reduction quantity of COO and start-up speed of the apparatus.

(c) Shut-Down Mode

This mode is a mode in which supply of the raw gas from the gas supplying device 12 is stopped and the outputs from all the power sources inclusive of the plasma producing power source 14, ion beam extracting power source 16, mass separating magnet power source 28, accelerating power source 32, energy separating magnet power source 36, scanning magnet power source 40 and beam paralleling magnet 44 are stopped.

This shut-down mode, in which supply of the raw gas and almost all the main power sources are stopped, is the slowest in the start-up of the apparatus in resuming the implantation among the three modes, but is the greatest in the reduction of COO inclusive of the consumption of the raw gas and power since almost all the devices are stopped.

Incidentally, it should be noted that the return from each of the modes (a) to (c) is implemented by e.g. the automatic control by the control device 58 or manually when the ion implantation for the substrate 48 is resumed (e.g. Immediately before the ion implantation is resumed).

(2) Modes Relative to Operation of Vacuum Pump

In this embodiment, this control device 58 has a function of executing the following operating modes of (d) and (e), as modes relative to the operating of the vacuum pump.

(d) Roughing Pump Low-Speed Mode

This mode is a mode in which the roughing pump 22 is controlled to operate at a revolving speed lower than a steady revolving speed under the conditions that (A) the interior of the beam line vacuum chamber 18 is a predetermined high vacuum state as described above and (B) the raw gas 6 is not supplied from the gas supplying device 12 to the ion source 2. This is because it is not necessary to operate the roughing pump 22 forcibly at the steady revolving speed under the conditions (A) and (B).

In this case, if the roughing pump 22 is a pump of introducing a nitrogen gas for dilution like a dry pump for chemical equipment, the introduction of the nitrogen gas may be stopped. In this embodiment, it is stopped. This is because the raw gas 6 is not supplied to the ion source 2 so that it is not considered to exhaust the raw gas 6.

The return from this mode is automatically implemented when either one of the above conditions does not hold, for example.

By adopting this operating mode, the reduction of COO mainly relative to the power consumption for operating the roughing pump 22 can be implemented. Where the introduction of the nitrogen gas for dilution is stopped, the used quantity of the nitrogen gas can be reduced. In addition, since the roughing pump 22 is not stopped, it can be quickly restored to the steady revolving speed when necessary.

(e) Vacuum Preliminary Chamber Pump Low-Speed Mode

This mode is a mode in which the vacuum preliminary chamber pump 56 is controlled to operate at a revolving speed lower than a steady revolving speed in response to a command from the outside by an operator, etc. when the interior of the vacuum preliminary chamber 54 has reached a predetermined vacuum degree as described above. This is because it is not necessary to operate the vacuum preliminary chamber pump 56 forcibly at the steady revolving speed when a long period continues during which the vacuum preliminary chamber 54 remains closed and the substrate is not passed through the vacuum preliminary chamber 54.

The return from this mode is automatically implemented for example immediately before the vacuum valve (not shown) described above between the implanting chamber 46 and vacuum preliminary chamber 54 is opened. More specifically, when the ions with a predetermined dose are implanted into the substrate 48 within the implanting chamber 46, where the substrate 48 is scanned plural number of times in the Y direction, the vacuum preliminary chamber pump 56 is restored to a steady revolving speed immediately before scanning at a predetermined number of times is completed (e.g. before the scanning is to be executed twice). The reason why the restoring is made before the scanning is to be executed twice is to give a slight spare time for restoration.

The adoption of this operating mode can reduce the COO mainly relative to the power consumption for operating the vacuum preliminary chamber pump 56. In addition, since the vacuum preliminary chamber pump 56 is not stopped, it can be quickly restored to the steady revolving speed when necessary.

In this ion implanting apparatus, the control device 58 is designed so that both modes of (d) and (e) of the operating can be selectively carried out. However, at least one of the operating modes has only to be carried out. In this case, also, the COO can be reduced as understood from the explanation.

(3) Mode Relative to Heat Exhaust

In this embodiment, the control device 58 further has a function of executing the mode relative to the heat exhaust. This mode is a mode in which the exhaust valve 62 is (A) half-opened when the interior of the beam line vacuum chamber 18 is in a predetermined high vacuum state as described above, and (B) fully-opened while the ion beam 4 is produced and introduced into the implanting chamber 46. Whether or not the state is in the state of (B) is decided e.g. by the condition of AND that all the magnet current values of the energy separating magnet 34, scanning magnet 38 and beam paralleling magnet 42 are larger than predetermined values.

In the state of (A), the quantity of generated heat within the cabinet 60 is little, whereas in the state of (B), it is nearly maximum. Therefore, by controlling the exhaust valve 62 as described above and using this information for controlling the revolving speed of an exhaust fan (not shown) attached at the tip of the exhaust duct 64, the exhaust fan can be operate at a reduced revolving speed according to an operating status of the ion implanting apparatus. As a result, the COO mainly relative to the power consumption for operating the exhaust fan can be reduced.

The selection or change of the mode, i.e. whether (1) modes relative to beam production, (2) modes relative to the operation of a vacuum pump and (3) mode to heat exhaustion should be executed, respectively, and which of the three modes (a) to (c) of the modes of (1) modes relative to beam production should be selected, and whether one or both of modes (d) and (e) of (2) modes relative to the operation of a vacuum pump should be executed, can be carried out by adopting one or plurality of e.g. (i) a command from a host control device for the control device 58, (ii) a command by an operator on the control device 58 (specifically, display) and (iii) a command by time elapse of a timer set by the operator on the control device 58 (specifically, display).

The (1) modes relative to beam production, (2) modes relative to the operation of a vacuum pump and (3) mode to heat exhaustion may be individually executed, in any combination thereof or all of them. In this embodiment, the control device 58 is designed to adopt any of these executing modes. As more modes are executed, the effect of reducing the COO can be enhanced.

Further, as regards (a) twilight mode, (b) magnet-off mode and (c) shut-down mode of the modes of (1) relative to the beam production, a desired mode of (a) to (c) may be directly executed according to the above commands, or otherwise, for example, according to the time elapse of the timer, these modes can be may be sequentially executed in the course of the mode (a)→mode (b)→mode (c).

Incidentally, it should be noted that the construction of the ion source 2 and power sources therefor as shown in FIG. 2 and that of the entire ion implanting apparatus as shown in FIG. 1 are exemplary and any other constructions may be adopted.

What is claimed is:

1. An ion implanting apparatus comprising:

an ion source for ionizing a raw gas to produce a plasma and extracting an ion beam from the plasma;

a gas supplying device for supplying the raw gas to the ion source;

a plasma producing power source for supplying a power for producing the plasma to the ion source;

an energy separating magnet for selectively deriving ions having specific energy from the ion beam extracted from the ion source;

an energy separating magnet power source for supplying a power for energy separation to the energy separating magnet;

a scanning magnet for scanning the ion beam derived from the energy separating magnet;

a scanning magnet power source for supplying a power for scanning to the scanning magnet;

a beam paralleling magnet for parallel-scanning the ion beam derived from the scanning magnet so that it is in parallel to a reference axis;

a beam paralleling magnet power source for supplying a power for beam paralleling to the beam paralleling magnet;

an implanting chamber in which a substrate is irradiated with the ion beam derived from the beam paralleling magnet to implant ions into the substrate; and a control device for controlling an operating state of the ion implanting apparatus in a period during which the ion implantation is not carried out for the substrate in a state in any mode selected from (a) a twilight mode in which a flow rate of the raw gas supplied from the gas supplying device to the ion source and the power supplied from the plasma producing power source to the ion source are reduced to values smaller than those when the ion implantation is carried out for the substrate and capable of keeping plasma production in the ion source; (b) a magnet-off mode in which the flow rate of the raw gas supplied from the gas supplying device to the ion source and the power supplied from the plasma producing power source to the ion source are reduced to values smaller than those when the ion implantation is carried out for the substrate and capable of keeping plasma production in the ion source, and outputs from the energy separating magnet power source, scanning magnet power source and beam paralleling magnet power source are stopped; and (c) a shut-down mode in which the supply of the raw gas from the gas supplying device to the ion source is stopped and outputs from the power sources are stopped.

2. The ion implanting apparatus according to claim 1, further comprising:

an ion beam extracting power source for applying a voltage for extracting the ion beam to the ion source;

a mass separating magnet for selectively deriving ions having a specific mass number and valence from the ion beam extracted from the ion source;

a mass separating magnet power source for supplying a power for mass separation to the mass separating magnet;

an accelerating tube for accelerating or decelerating the ion beam derived from the mass separating magnet; and an accelerating power source for applying a voltage for acceleration or deceleration to the accelerating tube, wherein in the shut-down mode (c), outputs from the ion beam extracting power source, the mass separating magnet power source and the accelerating power source are stopped.

3. The ion implanting apparatus of claim 1, further comprising:

a main pump and a roughing pump for vacuum evacuating an interior of a beam line vacuum chamber which is connected to the ion source and through which the ion beam passes;

a vacuum preliminary chamber in which the substrate is taken in and out between the implanting chamber and an external atmosphere;

a vacuum preliminary chamber pump for vacuum evacuating an interior of the vacuum preliminary chamber; and a vacuum control device for executing at least one of (a) a roughing pump low-speed mode in which the roughing pump is controlled to operate at a revolving speed lower than a steady revolving speed under conditions that the interior of the beam line vacuum chamber is in a predetermined high vacuum state and the raw gas is not supplied from the gas supplying device to the ion source; and (b) a vacuum preliminary chamber pump low-speed mode in which the vacuum preliminary chamber pump is controlled to operate at the revolving speed lower than the steady revolving speed when an interior of the vacuum preliminary chamber has reached a predetermined vacuum degree.

4. The ion implanting apparatus according to claim 1, further comprising:

a main pump and a roughing pump for vacuum evacuating an interior of a beam line vacuum chamber which is connected to the ion source and through which the ion beam passes;

a vacuum preliminary chamber in which the substrate is taken in and out between the implanting chamber and an external atmosphere; and a vacuum preliminary chamber pump for vacuum evacuating an interior of the vacuum preliminary chamber, wherein the control device executes at least one of (a) a roughing pump low-speed mode in which the roughing pump is controlled to operate at a revolving speed lower than a steady revolving speed under conditions that the interior of the beam line vacuum chamber is in a predetermined high vacuum state and the raw gas is not supplied from the gas supplying device to the ion source; and (b) a vacuum preliminary chamber pump low-speed mode in which the vacuum preliminary chamber pump is controlled to operate at the revolving speed lower than the steady revolving speed when an interior of the vacuum preliminary chamber has reached a predetermined vacuum degree.

5. An ion implanting method performed in ion implanting apparatus comprising an ion source, a gas supplying device, a plasma producing power source, an energy separating magnet, an energy separating magnet power source, a scanning magnet, a scanning magnet power source, a beam paralleling magnet, a beam paralleling magnet power source and an implanting camber, the method comprising:

ionizing a raw gas to produce a plasma and extracting an ion beam from the plasma in the ion source;

supplying the raw gas to the ion source from the gas supplying device;

supplying a power for producing the plasma to the ion source from the plasma producing power source;

selectively deriving ions having specific energy from the ion beam extracted from the ion source by the energy separating magnet;

supplying a power for energy separation to the energy separating magnet from the energy separating magnet power source;

scanning the ion beam derived from the energy separating magnet by the scanning magnet;

supplying a power for scanning to the scanning magnet from the scanning magnet power source;

parallel-scanning the ion beam derived from the scanning magnet so that it is in parallel to a reference axis by the beam paralleling magnet;

supplying a power for beam paralleling to the beam paralleling magnet from the beam paralleling magnet power source;

irradiating a substrate with the ion beam derived from the beam paralleling magnet to implant ions into the substrate; and controlling an operating state of the ion implanting apparatus in a period during which the ion implantation is not carried out for the substrate in a state in any mode selected from (a) a twilight mode in which a flow rate of the raw gas supplied from the gas supplying device to the ion source and the power supplied from the plasma producing power source to the ion source are reduced to values smaller than those when the ion implantation is carried out for the substrate and capable of keeping plasma production in the ion source; (b) a magnet-off mode in which the flow rate of the raw gas supplied from the gas supplying device to the ion source and the power supplied from the plasma producing power source to the ion source are reduced to values smaller than those when the ion implantation is carried out for the substrate and capable of keeping plasma production in the ion source, and outputs from the energy separating magnet power source, scanning magnet power source and beam paralleling magnet power source are stopped; and (c) a shut-down mode in which the supply of the raw gas from the gas supplying device to the ion source is stopped and outputs from the power sources are stopped.

6. The ion implanting method of claim 5. further comprising:

vacuum evacuating an interior of a beam line vacuum chamber which is connected to the ion source and through which the ion beam passes by a main pump and a roughing pump;

taking in and out the substrate between the implanting chamber and an external atmosphere via a vacuum preliminary chamber;

vacuum evacuating an interior of the vacuum preliminary chamber by a vacuum preliminary chamber pump; and executing at least one of (a) a roughing pump low-speed mode in which the roughing pump is controlled to operate at a revolving speed lower than a steady revolving speed under conditions that the interior of the beam line vacuum chamber is in a predetermined high vacuum state and the raw gas is not supplied from the gas supplying device to the ion source; and (b) a vacuum preliminary chamber pump low-speed mode in which the vacuum preliminary chamber pump is controlled to operate at the revolving speed lower than the steady revolving speed when an interior of the vacuum preliminary chamber has reached a predetermined vacuum degree.

* * * * *

UNITED STATES PATENT AND TRADEMARK OFFICE
CERTIFICATE OF CORRECTION

PATENT NO. : 6,800,862 B2
DATED : October 5, 2004
INVENTOR(S) : Takao Matsumoto et al.

It is certified that error appears in the above-identified patent and that said Letters Patent is hereby corrected as shown below:

Column 12,
Line 25, "camber," should read -- chamber, --.

Column 13,
Line 9, "claim 5." should read -- claim 5, --.

Signed and Sealed this

First Day of February, 2005

JON W. DUDAS
*Director of the United States Patent and Trademark Office*